(12) United States Patent
Breitwisch et al.

(10) Patent No.: US 7,927,911 B2
(45) Date of Patent: Apr. 19, 2011

(54) WAFER BONDED ACCESS DEVICE FOR MULTI-LAYER PHASE CHANGE MEMORY USING LOCK-AND-KEY ALIGNMENT

(75) Inventors: Matthew J. Breitwisch, Yorktown Heights, NY (US); Kuan-Neng Chen, Hsinchu (TW)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 12/550,014

(22) Filed: Aug. 28, 2009

(65) Prior Publication Data

US 2011/0049455 A1    Mar. 3, 2011

(51) Int. Cl.
 *H01L 21/00* (2006.01)
(52) U.S. Cl. .......... 438/95; 438/102; 257/2; 257/42; 257/E21.068; 257/E29.087; 257/E29.1; 257/E47.001
(58) Field of Classification Search .......... None
See application file for complete search history.

(56) References Cited

U.S. PATENT DOCUMENTS

| | | | |
|---|---|---|---|
| 5,118,299 A | 6/1992 | Burns et al. | |
| 5,903,059 A | 5/1999 | Bertin et al. | |
| 5,956,575 A | 9/1999 | Bertin et al. | |
| 6,393,685 B1 | 5/2002 | Collins | |
| 7,057,923 B2 * | 6/2006 | Furkay et al. | 365/163 |
| 2001/0032702 A1 | 10/2001 | Feldman et al. | |
| 2004/0077123 A1 * | 4/2004 | Lee et al. | 438/102 |
| 2004/0195604 A1 * | 10/2004 | Hwang et al. | 257/295 |
| 2005/0180191 A1 * | 8/2005 | Xu | 365/145 |
| 2007/0158395 A1 | 7/2007 | Fasano et al. | |
| 2008/0178436 A1 | 7/2008 | Zhang et al. | |

\* cited by examiner

*Primary Examiner* — Charles D Garber
*Assistant Examiner* — Yasser A Abdelaziez
(74) *Attorney, Agent, or Firm* — Cantor Colburn LLP; Vazken Alexanian

(57) ABSTRACT

A method for fabricating a multi-layer phase change memory device includes forming a phase change memory layer including a plurality of phase change memory elements on a word line formed on a plurality of semiconductor devices on a first semiconductor substrate, each phase change element having a notch formed at an upper surface thereof, forming an access device layer including plurality of access devices on a second semiconductor substrate, each access device having a conductive bump formed thereon, and combining the first and second semiconductor substrates and slidably inserting and locking each conductive bump of the plurality of access devices into each notch of the plurality of phase change memory elements to electrically connect the access devices to the phase change memory elements.

23 Claims, 8 Drawing Sheets

WAFER BONDED ACCESS DEVICE FOR MULTI-LAYER PHASE CHANGE MEMORY USING LOCK-AND-KEY ALIGNMENT

BACKGROUND

The present invention relates generally to phase change memory cells, and more specifically, to a wafer bonded access device for multi-layer phase change memory using a lock-and-key alignment method.

In phase change memory devices, a phase change memory cell typically requires an access device with high current density and a large on/off ratio. Three-dimensional (3-D) integration stacks of phase change memory cells provide a solution for the challenge due to temperature budget requirements. Typically the processing temperature may not exceed 400 degrees Celsius otherwise the underlying MOSFET characteristics may be compromised. Most access devices which meet the high current density and large on/off ratio requirements require processing temperatures which exceed the 400 degrees Celsius processing temperature. In addition, forming a single-crystalline Si access device on top of a non-single crystalline Si substrate is extremely difficult, if not impossible, while keeping the temperature budget below 400 C. A multiplicity of polycrystalline Si access devices will result in a large variability in the access device performances due to the random nature of the crystallites within the polycrystalline Si material.

SUMMARY

The present invention provides a method for fabricating multi-layer of phase change memory devices including layers of phase change memory elements and access devices on top of underlying complementary metal oxide semiconductor field effect transistor (CMOSFET) circuitry without affecting the CMOSFET device characteristics. The present invention provides a method where the CMOSFET circuitry plus a layer of densely packed phase change elements are first formed on a first semiconductor substrate, then a dense array of access devices are formed on a second semiconductor substrate, and the first and second semiconductor substrates are combined using a lock-and-key wafer bonding technique such that the access devices are electrically connected to the phase change elements.

According to one embodiment of the present invention, a method for fabricating a multi-layer phase change memory device is provided. The method includes forming a phase change memory layer including a plurality of phase change memory elements on a word line formed on a plurality of semiconductor devices on a first semiconductor substrate, each phase change element having a notch formed at an upper surface thereof, forming an access device layer including plurality of access devices on a second semiconductor substrate, each access device having a conductive bump formed thereon, and combining the first and second semiconductor substrates and slidably inserting and locking each conductive bump of the plurality of access devices into each notch of the plurality of phase change memory elements to electrically connect the access devices to the phase change memory elements.

According to another embodiment of the present invention, a multi-layer phase change memory device is provided. The multi-layer phase change memory device includes a semiconductor substrate, a plurality of semiconductor devices formed on the semiconductor structure, and a plurality of wiring layers formed on the semiconductor devices and having a word line formed at an upper layer of the wiring layers. The device further includes a phase change memory layer formed on the wiring layers and including plurality of phase change memory elements connected with the word line and each having a notch formed at an upper surface thereof. An access device layer is provided including a plurality of access devices, each access device having a conductive bump formed thereon, each conductive bump being locked in each notch to electrically connect the access devices to the phase change memory elements.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

The present invention embodiments provide a way of interconnecting structures within a semiconductor structure such that they can function as if the structures were formed on the same substrate. More specifically, the present invention embodiments provide a method for fabricating an access device for a multilayer phase change memory devices using a lock-and-key alignment operation. A plurality of phase change memory elements are formed on a first semiconductor substrate, and a plurality of access devices (e.g., diodes) are formed on a second substrate. The first and second substrates are combined via a bonding operation to provide a physical connection and an electrical connection between the phase change memory elements and the access devices.

Figure 1:
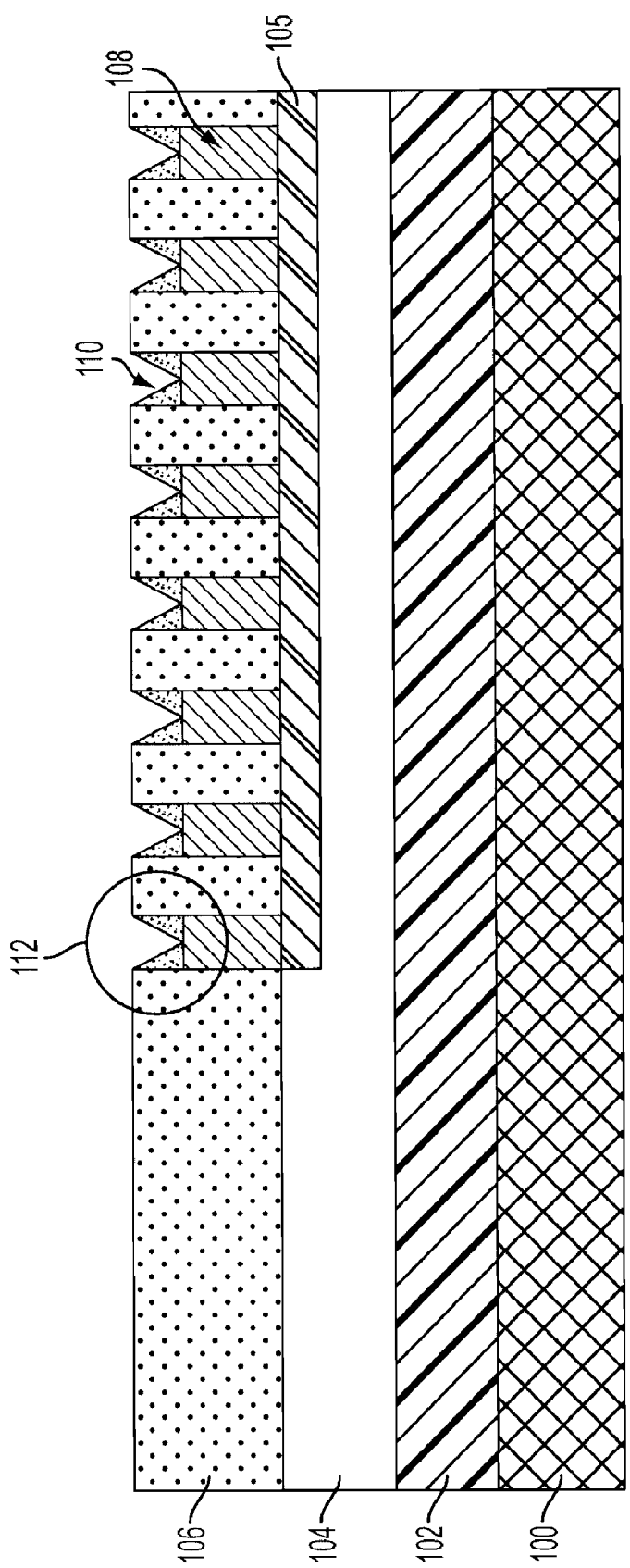
FIG. 1 is a diagram illustrating a first semiconductor substrate including a plurality of phase change memory elements that can be implemented within embodiments of the present invention.

With reference now to FIG. 1, a first substrate of a semiconductor structure including a plurality of phase change memory elements according to embodiments of the present invention is provided. As shown in FIG. 1, a first semiconductor substrate 100 is provided having a plurality of semiconductor devices 102 formed thereon. The first semiconductor substrate 100 may be formed of silicon, for example. The semiconductor devices 102 may include complementary metal oxide semiconductor (CMOS) devices, for example. Wiring layers 104 including a plurality of metal regions (e.g., M1, M2, and M3) are formed on the semiconductor devices 102. An upper metal region of the wiring layers 104 is used as a word line 105. A phase change memory layer 106 is formed on the wiring layers 104. The phase change memory layer 106 includes a plurality of phase change memory elements 108. The phase change memory elements 108 are connected to the word line 105 of the wiring layers 104.

According to an embodiment of the present invention, the plurality of phase change memory elements 108 may be made of germanium-antimony-telluride (GeSbTe) or one of alloys of gallium (Ga)/Sb, indium (In)/Sb, In/selenium (Se), Sb/Te, Ge/Te, In/Sb/Te, Ga/Se/Te, Sn/Sb/Te, In/Sb/Ge, silver (Ag)/In/Sb/Te, Ge/Sb/Se/Te, Te/Ge/Sb/sulfur (S).

Further, according to an embodiment of the present invention, each phase change memory element 108 includes a generally V-shaped or tapered notch 110 at an upper surface thereof. Each notch 110 of a phase change memory element 108 is a predetermined distance from an adjacent notch 110 on a neighboring phase change memory element 108. The notch 110 is formed of a conductive material and is used for performing a lock-in wafer bonding operation as discussed below with reference to FIGS. 3 and 4. The notch 110 acts as a slide "lock" structure and facilitate the misalignment of the access devices including a "key" structure to slide therein. A dummy notch 112 is formed adjacent to the plurality of phase change memory elements 108 for alignment purposes. Each notch 110 is formed of a predetermined width and includes inclined portions having an angle of approximately 10 to approximately 45 degrees formed at outer edges of the upper surface of the phase change memory elements 108. According to an embodiment of the present invention, a bottom portion of each notch 110 is formed of a conductive material such as platinum (Pt), tungsten (W), titanium nitride (TiN), tantalum nitride (TaN) or copper (Cu). Sidewall portions of the notch are formed of non-conductive material such as silicon nitride (SiN) or silicon oxide (SiO). The key structure and plurality of access devices formed on a second substrate will now be described below with reference to FIG. 2.

Figure 2:
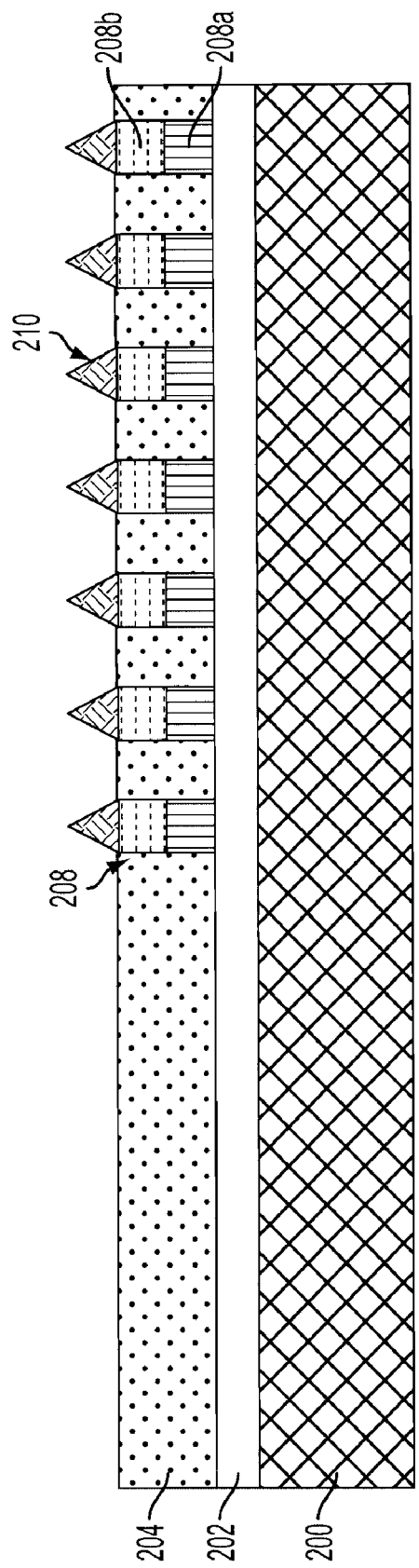
FIG. 2 is a diagram illustrating a second semiconductor substrate including a plurality of access devices that can be implemented within embodiments of the present invention.

In FIG. 2, a second semiconductor substrate 200 is provided including a dielectric layer 202. The semiconductor substrate 200 may be made of silicon, for example. The dielectric layer 202 may be formed of silicon nitride (SiN) or silicon dioxide ($SiO_2$), for example. An access device layer 204 is formed on the dielectric layer 202. The access device layer 204 includes a plurality of access devices 208 e.g., single crystal silicon (Si) p/n diodes having a n-type silicon 208a and a p-type silicon 208b. The present invention is not limited to any particular access devices 208 and may vary as necessary.

According to an embodiment of the present invention, the access devices 208 each include a conductive bump 210 on an upper surface thereof for performing a lock-in wafer bonding operation as discussed below with reference to FIGS. 3 and 4. According to an embodiment of the present invention, the conductive bump 210 is a dome-shaped "key" structure to be slidably inserted into the notch 110 of each phase change memory element 108 formed on the first semiconductor substrate 100. The conductive bump 210 is comparable in size to the notch 110 of each phase change memory element 103 and correspond to the inclined portions of the notch 110, in order to be fit securely therein. A wafer bonding operation of the first and second semiconductor substrates 100 and 200 will now be described below with reference to FIGS. 3 and 4.

Figure 3:
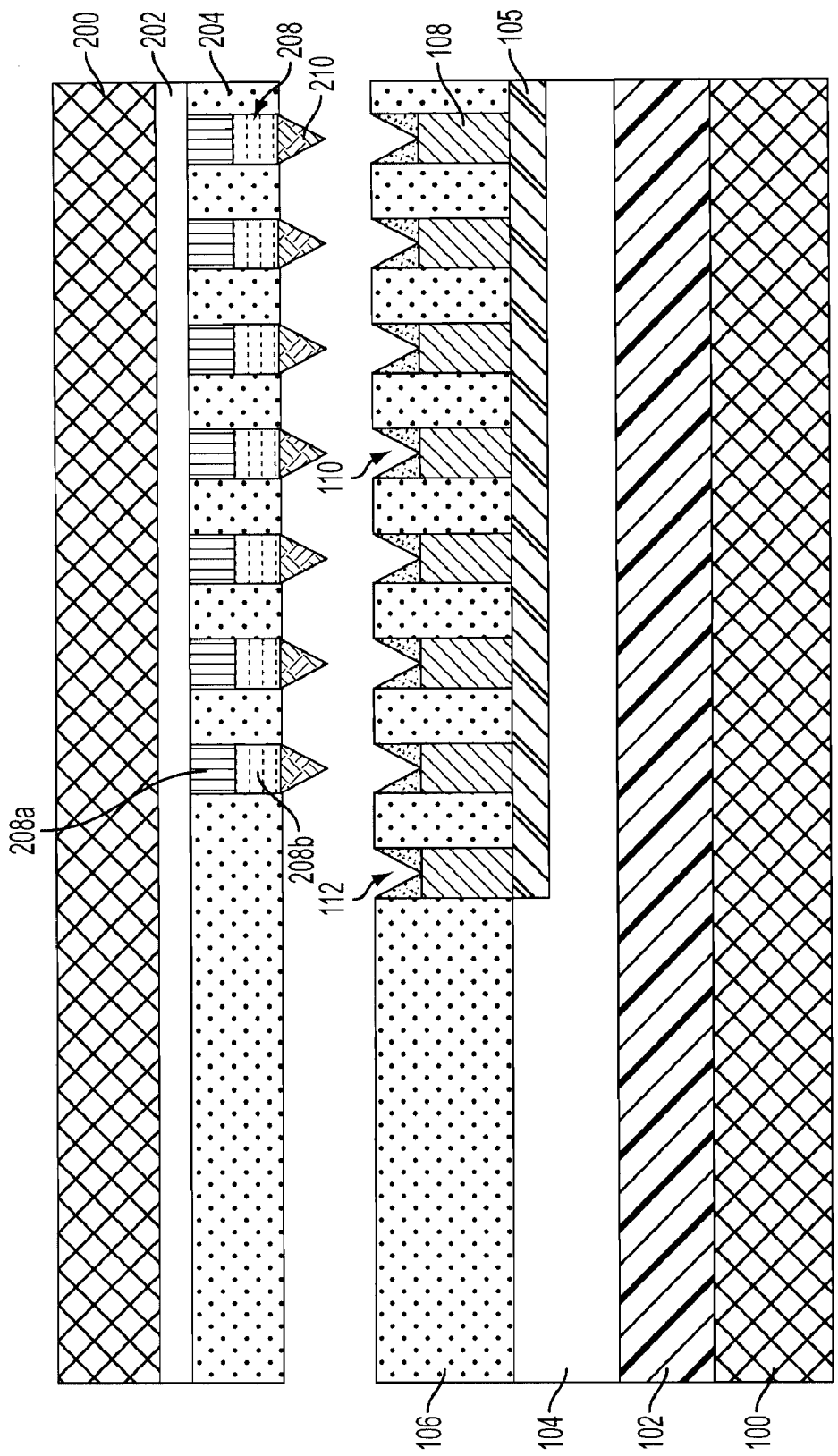
FIG. 3 is a diagram illustrating the first and second semiconductor substrates shown in FIGS. 1 and 2 that can be implemented within embodiments of the present invention.
Figure 4:
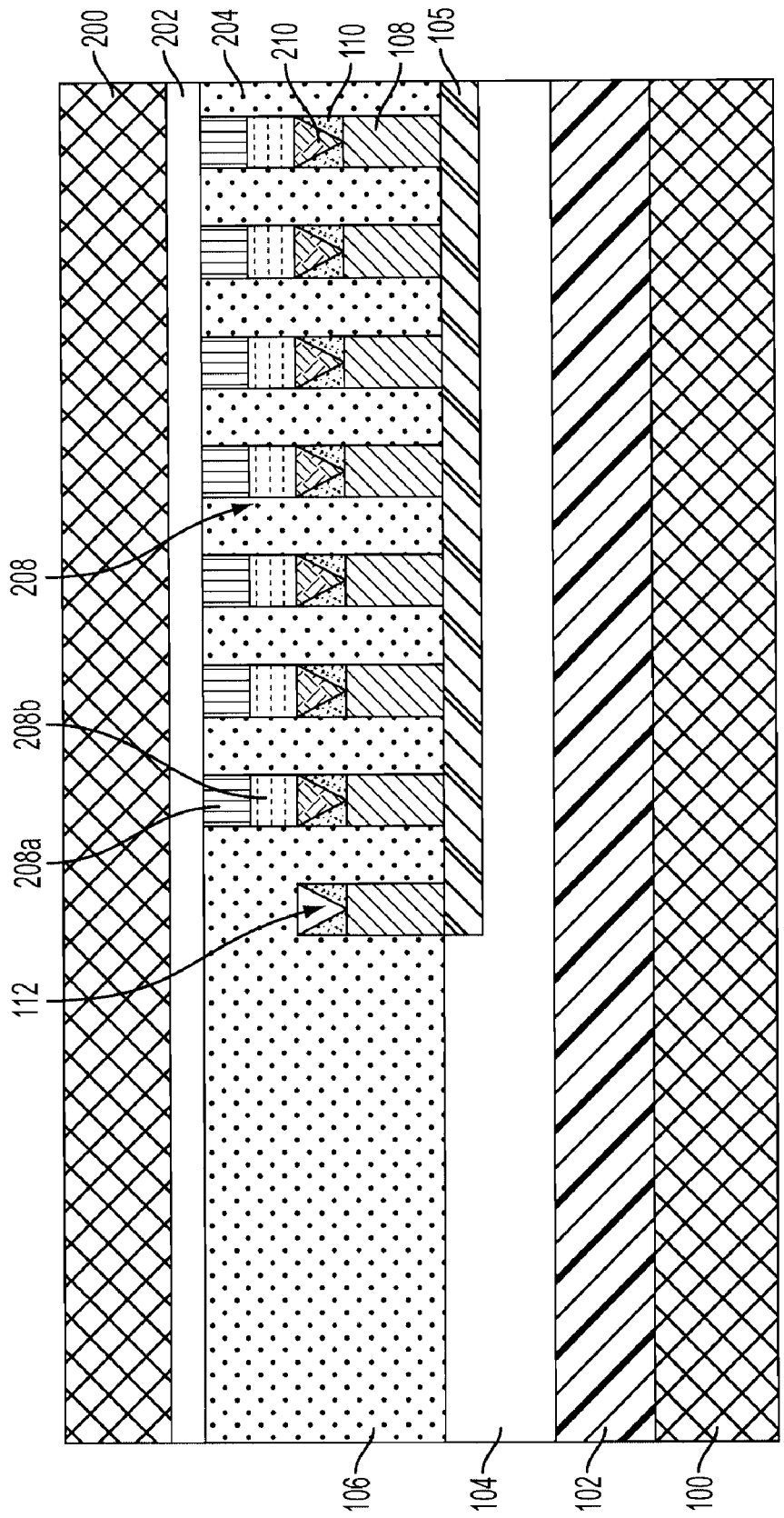
FIG. 4 is a diagram illustrating a lock-and-key bonding operation of the first and second semiconductor substrates shown in FIG. 3 that can be implemented within embodiments of the present invention.

In FIG. 3, the second semiconductor substrate 200 including the plurality of access devices 208 is positioned above the first semiconductor substrate 100 such that the plurality of access devices 208 are faced opposite the plurality of phase change memory elements 108. The plurality of access devices 208 are then aligned to perform a slide lock-in operation to slidably insert the conductive bumps 210 into and lock into each notch 110 of the phase change memory elements 108. In FIG. 4, the conductive bump 210 of each access device 208 is slidably inserted into a respective notch 110 of a phase change memory element 108 and fit securely therein. When performing the slide lock-in operation, the dummy notch 112 aids in correcting the misalignment of the conductive bumps 210 of the access devices 208. As shown in FIG. 4, the conductive bumps 210 and the notches 108 are in contact to provide physical connection and electrical connection of the access devices 208 and the phase change memory elements 108. Further, fabrication of the semiconductor structure will now be described with reference to FIGS. 5 through 8.

Figure 5:
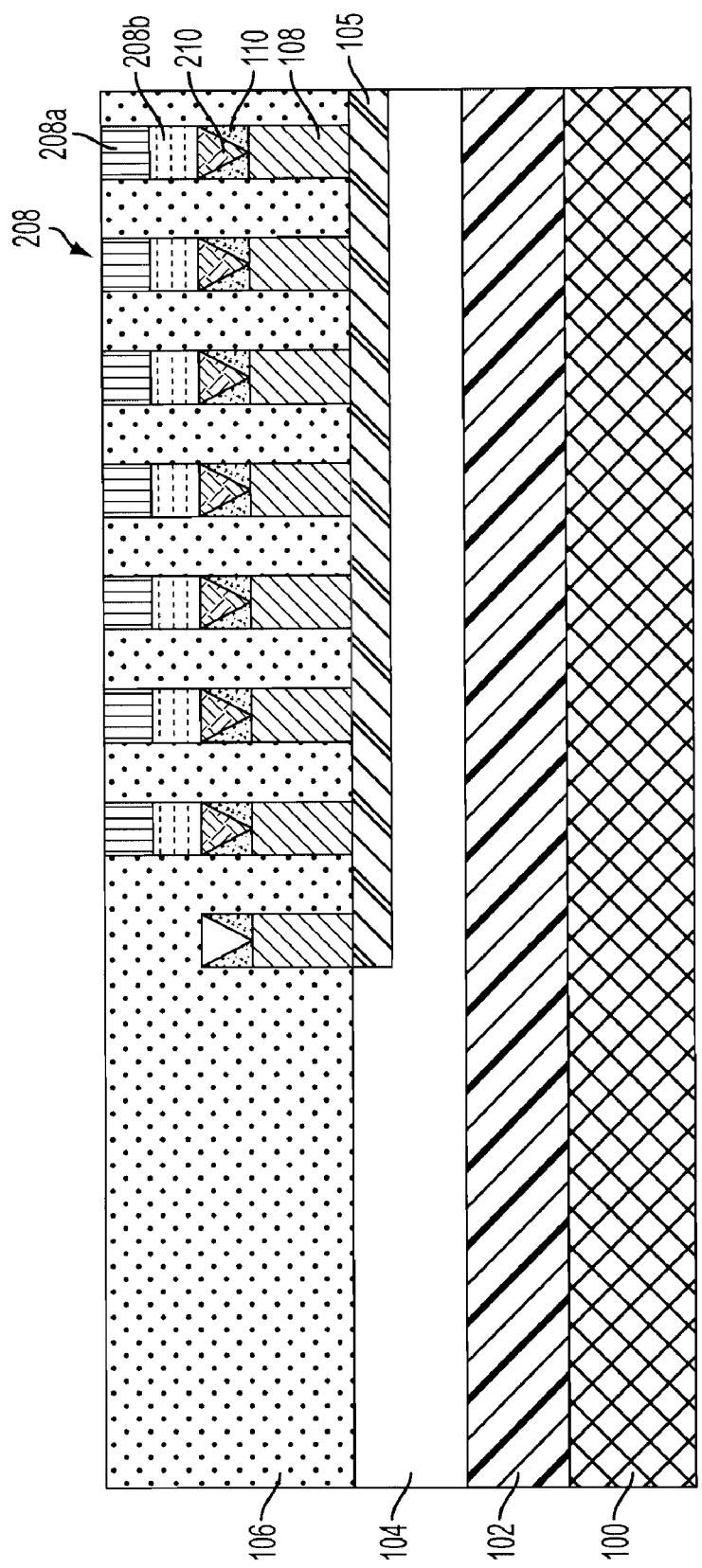
FIG. 5 is a diagram illustrating and etching and grinding operation of the multi-layer phase change memory device that can be implemented within embodiments of the present invention.

FIG. 5 is a diagram illustrating a removal operation of the second semiconductor substrate that can be implemented within embodiments of the present invention. As shown in FIG. 5, the second semiconductor substrate 200 is removed via a grinding and etching operation at a desired level. As can be seen in FIG. 5, the second semiconductor substrate 200 is etched such that a surface of each access device 208 is exposed. For example, in FIG. 5, the n-type silicon 208a of each access device 208 is exposed. The formation of a bit line on the access devices will now be described with reference to FIG. 6.

Figure 6:
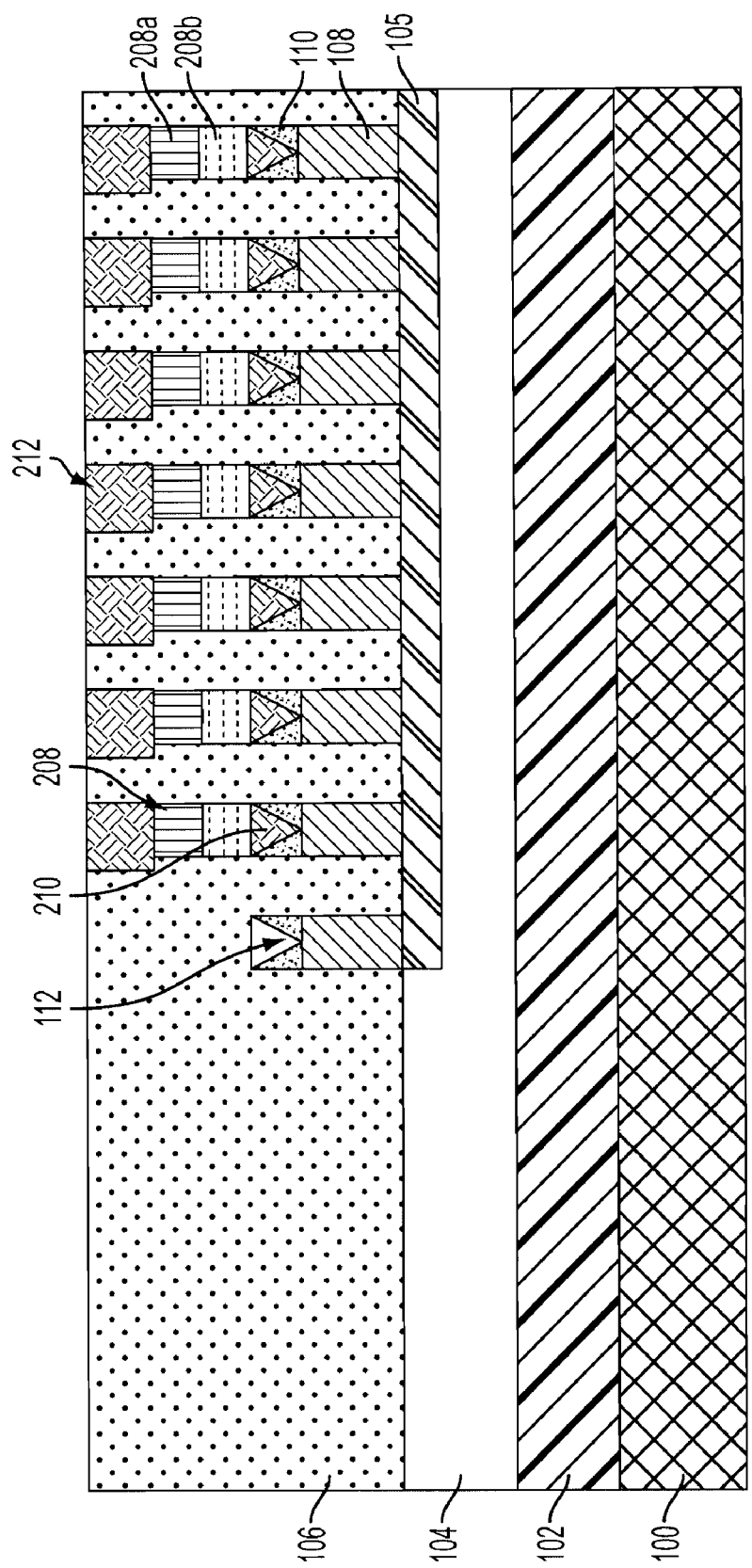
FIG. 6 is a diagram illustrating formation operation of bit line wirings of the phase change memory device that can be implemented within embodiments of the present invention.

As shown in FIG. 6, bit line 212 is formed on the access devices 208. The n-type silicon 208a of each access device 208 is electrically coupled to the bit line 212. A next layer in the multi-layer phase change memory will now be described with reference to FIGS. 7 and 8.

Figure 7:
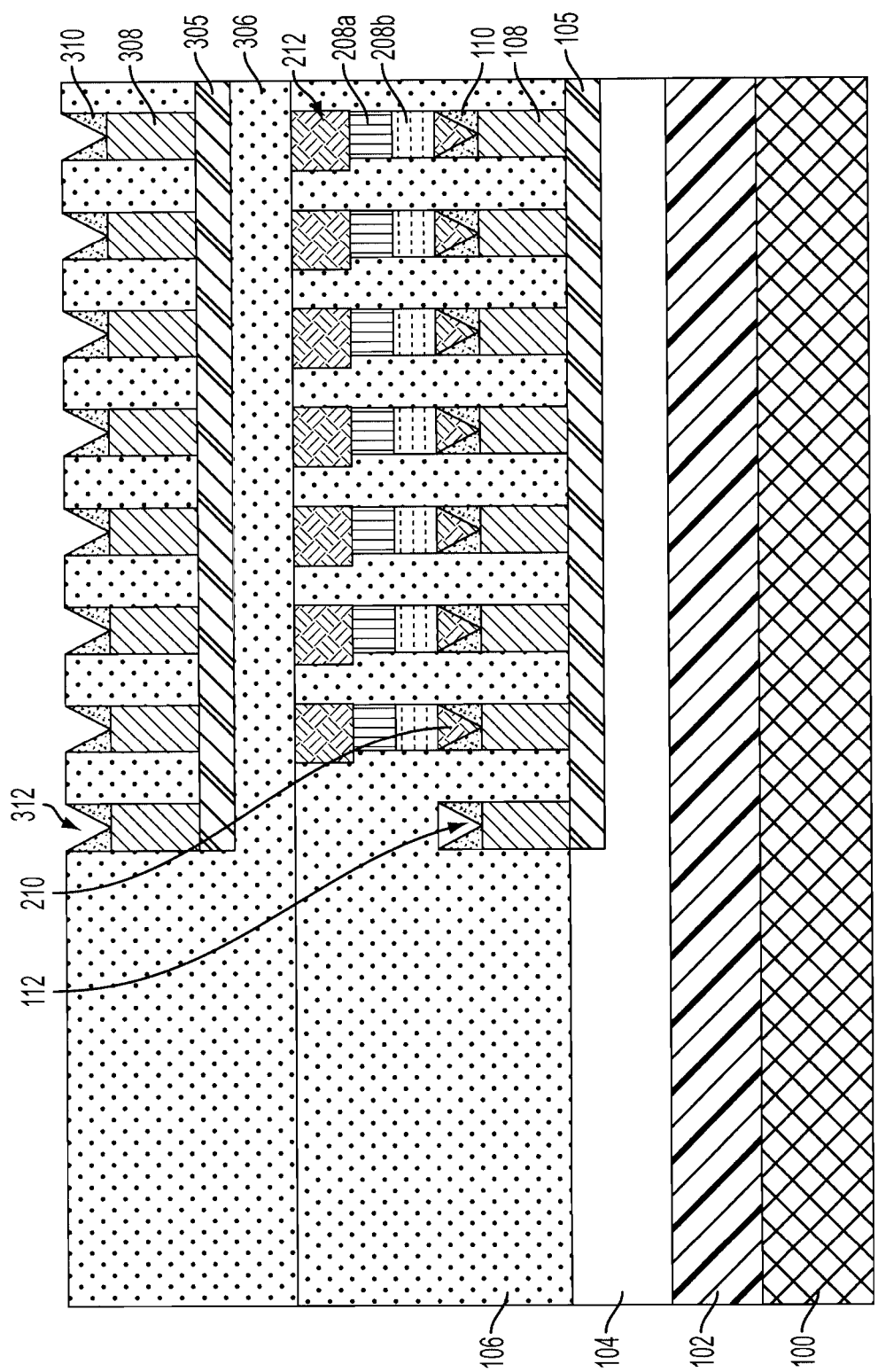
FIG. 7 is a diagram illustrating fabrication operation of second word line and additional phase change memory layers of the multi-layer phase change memory device that can be implemented within embodiments of the present invention.

FIG. 7 is a diagram illustrating the formation of a second phase change memory layer within the semiconductor structure that can be implemented within embodiments of the present invention. As shown in FIG. 7, a second word line 305 is formed within a dielectric layer 306. A second plurality of phase change memory elements 308 are formed above the second word line 305 and are connected with the second word line 305. According to an embodiment of the present invention, the phase change memory elements 308 are formed similar to the phase change memory elements 108 shown in FIG. 1. The phase change memory elements 308 each include a notch 310. A dummy notch 312 is also provided and is formed similar to the dummy notch 112 shown in FIG. 1.

Figure 8:
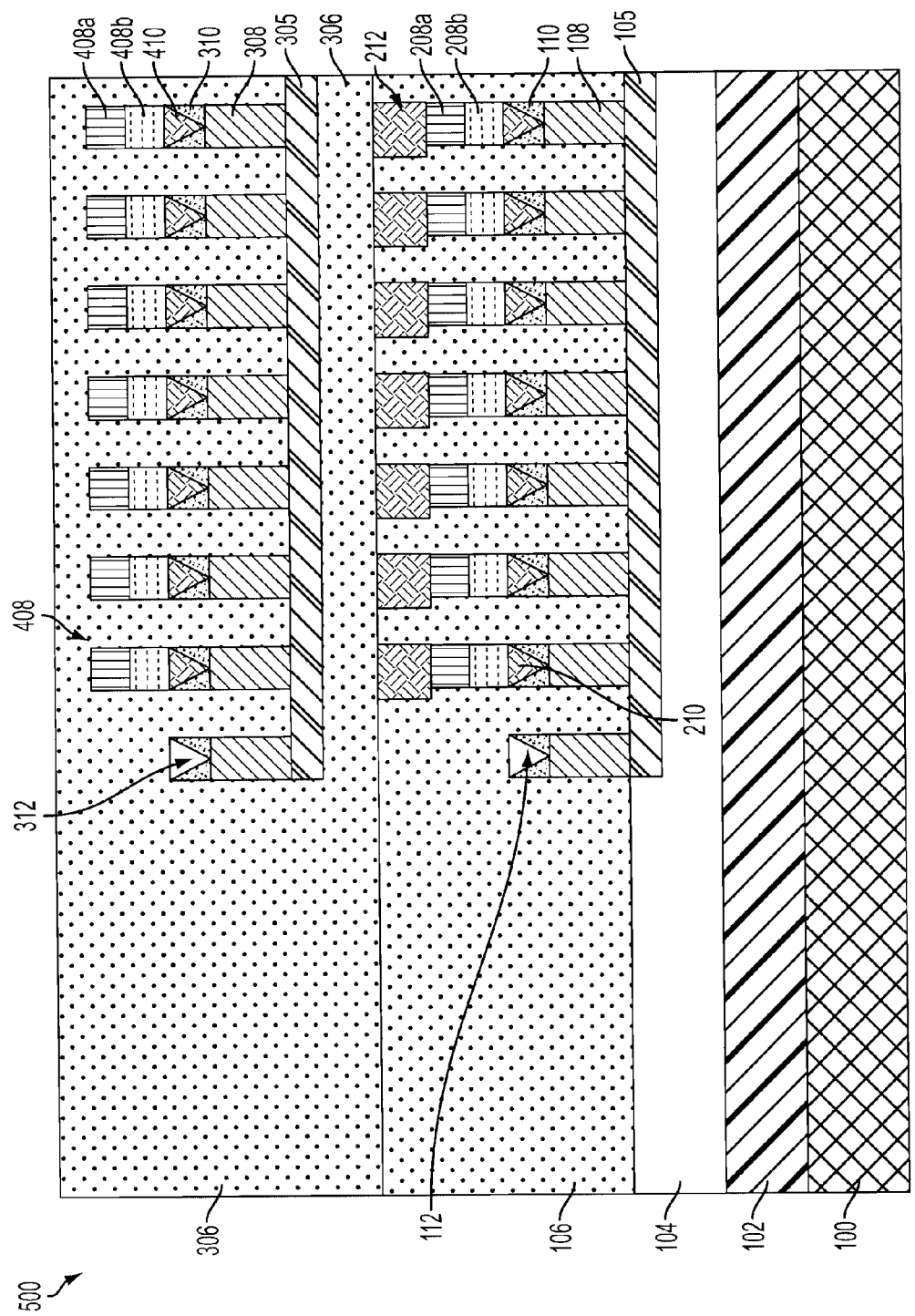
FIG. 8 is a diagram illustrating a lock-and-key bonding operation of a second access device layer that can be implemented within embodiments of the present invention.

In FIG. 8, a second access device layer including a second plurality of access devices 408 is formed on a third semiconductor substrate (not shown) similar to the first access device layer 204 shown in FIG. 2. According to an embodiment of the present invention, the second plurality of access devices 408 are single crystal silicon (Si) p/n diodes having a n-type silicon 408a and a p-type silicon 408b. The access devices 408 each include a conductive bump 410 which is slidably inserted into and locked in a respective notch 310 of each phase change memory element 308. The third substrate (not shown) is then removed via an etching operation. As a result, a multi-layer phase change memory 500 according to an embodiment of the present invention has been fabricated. According to an embodiment of the present invention, the process shown in FIGS. 7 and 8 may be repeated as necessary to form additional phase change memory cell layers.

Embodiments of the present invention provide a method of fabricating a multi-layer phase change memory (e.g., multiple 3-D layers of phase change element plus access device cells) on top underlying CMOSFET circuitry without affecting the CMOSFET characteristics by first fabricating the CMOSFET circuitry having a plurality of phase change memory elements on one semiconductor substrate and a plurality of access devices formed on another semiconductor substrate and fabricating associated wiring layers. Then, combining the two substrates using a lock-and-key wafer bonding operation to electrically connect the phase change element with the access elements. The present invention also provide additional advantages such as an increased simplicity of fabrication of the access device layers, where each layer of access devices can be fabricated using identical processing conditions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for fabricating a multi-layer phase change memory device, the method comprising:
   forming a phase change memory layer including a plurality of phase change memory elements on a word line formed on a plurality of semiconductor devices on a first semiconductor substrate, each phase change element having a notch formed at an upper surface thereof;
   forming an access device layer including plurality of access devices on a second semiconductor substrate, each access device having a conductive bump formed thereon;
   combining the first and second semiconductor substrates and slidably inserting and locking each conductive bump of the plurality of access devices into each notch of the plurality of phase change memory elements to electrically connect the access devices to the phase change memory elements.

2. The method of claim 1, wherein combining the first and second semiconductor substrates comprises:
   aligning the plurality of access devices on the second semiconductor substrate opposite the plurality of phase change memory elements on the first semiconductor substrate;
   slidably inserting each conductive bump into the notch of each phase change memory element; and
   locking the conductive bumps into the notches.

3. The method of claim 2, further comprising:
   forming a dummy notch adjacent to the plurality of phase change memory elements; and
   correcting a misalignment of the conductive bumps being slidably inserted into each notch, using the dummy notch.

4. The method of claim 2, further comprising:
   removing the second semiconductor substrate via an etching operation; and
   forming a bit line to be connected with each access device.

5. The method of claim 4, further comprising:
   forming another phase change memory layer on another word line above the bit line, the other phase change memory layer including a plurality of phase change memory elements each have a notch on an upper surface thereof;
   forming another access device layer including a plurality of access devices each having a conductive bump;
   aligning the other access device layer opposite the other phase change memory layer; and
   slidably inserting the conductive bumps of plurality of access devices of the other access device layer into each notch of the plurality of phase change memory elements of the other phase change memory layer.

6. The method of claim 1, wherein the semiconductor devices are complementary metal oxide semiconductor (CMOS) devices.

7. The method of claim 1, wherein the access devices are single crystal silicon (Si) p/n diodes.

8. The method of claim 1, wherein each notch is a predetermined distance from an adjacent notch on a neighboring phase change memory element.

9. The method of claim 8, wherein each notch is formed of a conductive material and of a predetermined width and comprises inclined portions at outer edges of the upper surface of the phase change memory elements.

10. The method of claim 9, wherein the inclined portions include an angle of approximately 10 to approximately 45 degrees.

11. The method of claim 10, wherein each conductive bump is of a dome-shaped to be slidably inserted into each notch of each phase change memory.

12. The method of claim 11, wherein each conductive bump is of a size corresponding to the inclined portions of each notch to be fit securely therein.

13. A multi-layer phase change memory device comprising:
- a semiconductor substrate;
- a plurality of semiconductor devices formed on the semiconductor structure;
- a plurality of wiring layers formed on the semiconductor devices and having a word line formed at an upper layer of the wiring layers;
- a phase change memory layer formed on the wiring layers and including plurality of phase change memory elements connected with the word line and each having a notch formed at an upper surface thereof; and
- an access device layer including a plurality of access devices, each access device having a conductive bump formed thereon, each conductive bump being locked in each notch to electrically connect the access devices to the phase change memory elements.

14. The multi-layer phase change memory device of claim 13, wherein the plurality of access devices are formed on another semiconductor substrate opposite the plurality of phase change memory elements on the semiconductor substrate and each conductive bump is slidably inserted into the notch of each phase change memory element to lock the conductive bumps into the notches.

15. The multi-layer phase change memory device of claim 14, further comprising:
- a dummy notch adjacent to the plurality of phase change memory elements configured to correct a misalignment of the conductive bumps being slidably inserted into each notch.

16. The multi-layer phase change memory device of claim 15, wherein the other semiconductor substrate is removed via an etching operation and a bit line to be connected with each access device is formed.

17. The multi-layer phase change memory device of claim 15, further comprising:
- another phase change memory layer formed on another word line above the bit line, the other phase change memory layer including a plurality of phase change memory elements each have a notch on an upper surface thereof;
- another access device layer including a plurality of access devices each having a conductive bump, wherein the other access device layer is aligned opposite the other phase change memory layer and the conductive bumps of the plurality of access devices of the other access device layer are locked in each notch of the plurality of phase change memory elements of the other phase change memory layer.

18. The multi-layer phase change memory device of claim 13, wherein the semiconductor devices are complementary metal oxide semiconductor (CMOS) devices and the access devices are single crystal silicon (Si) p/n diodes.

19. The multi-layer phase change memory device of claim 13, wherein each notch is a predetermined distance from an adjacent notch on a neighboring phase change memory element.

20. The multi-layer phase change memory device of claim 19, wherein each notch is formed of a conductive material and of a predetermined width and comprises inclined portions at outer edges of the upper surface of the phase change memory elements.

21. The multi-layer phase change memory device of claim 20, wherein the inclined portions include an angle of approximately 10 to approximately 45 degrees.

22. The multi-layer phase change memory device of claim 21, wherein each conductive bump is of a dome-shaped to be slidably inserted into each notch of each phase change memory.

23. The multi-layer phase change memory device of claim 22, wherein each conductive bump is of a size corresponding to the inclined portions of each notch to be fit securely therein.

* * * * *